United States Patent
Shichijo et al.

(10) Patent No.: US 11,024,770 B2
(45) Date of Patent: Jun. 1, 2021

(54) LIGHT EMITTING ELEMENT AND LIGHT EMITTING DEVICE

(71) Applicant: NICHIA CORPORATION, Anan (JP)

(72) Inventors: Satoshi Shichijo, Tokushima (JP); Hiroki Fukuta, Anan (JP); Kunihito Sugimoto, Anan (JP); Yasuhiro Miki, Tokushima (JP); Koichi Takenaga, Tokushima (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/123,274

(22) Filed: Sep. 6, 2018

(65) Prior Publication Data

US 2019/0097086 A1 Mar. 28, 2019

(30) Foreign Application Priority Data

Sep. 25, 2017 (JP) .............................. JP2017-183860
Feb. 8, 2018 (JP) .............................. JP2018-020681

(51) Int. Cl.
*H01L 33/38* (2010.01)
*H01L 23/532* (2006.01)
(Continued)

(52) U.S. Cl.
CPC .......... *H01L 33/38* (2013.01); *H01L 23/5329* (2013.01); *H01L 33/10* (2013.01);
(Continued)

(58) Field of Classification Search
CPC ..... H01L 33/38; H01L 23/5329; H01L 33/10; H01L 33/62; H01L 33/44; H01L 33/54;
(Continued)

(56) References Cited

U.S. PATENT DOCUMENTS

2009/0283787 A1* 11/2009 Donofrio .............. H01L 33/405
257/98
2010/0117111 A1 5/2010 Illek et al.
(Continued)

FOREIGN PATENT DOCUMENTS

JP 2010-525586 A 7/2010
JP 2014-093480 A 5/2014
(Continued)

*Primary Examiner* — Su C Kim
(74) *Attorney, Agent, or Firm* — Global IP Counselors, LLP (57) ABSTRACT

A light emitting element includes a semiconductor layered body, an insulating film, first and second electrodes, and first and second external connection parts. The first semiconductor layer is exposed from the light emitting layer and the second semiconductor layer at exposed portions arranged in columns each extending in a first direction. The insulating film defines openings respectively located above the exposed portions. The first electrode is connected to the first semiconductor layer through the openings and covers a part of the second semiconductor layer via the insulating film. The first external connection part is connected to the first electrode and spaced apart from the exposed portions in the plan view. The first external connection part has a shape elongated in the first direction between adjacent ones of the columns of the exposed portions. The second external connection part is connected to the second semiconductor layer via the second electrode.

20 Claims, 5 Drawing Sheets

(51) Int. Cl.
- *H01L 33/10* (2010.01)
- *H01L 33/62* (2010.01)
- *H01L 33/40* (2010.01)
- *H01L 33/32* (2010.01)
- *H01L 33/50* (2010.01)
- *H01L 33/54* (2010.01)
- *H01L 33/44* (2010.01)

(52) U.S. Cl.
CPC ............ *H01L 33/382* (2013.01); *H01L 33/62* (2013.01); *H01L 33/32* (2013.01); *H01L 33/387* (2013.01); *H01L 33/405* (2013.01); *H01L 33/44* (2013.01); *H01L 33/505* (2013.01); *H01L 33/54* (2013.01); *H01L 2933/0091* (2013.01)

(58) Field of Classification Search
CPC ..... H01L 33/382; H01L 33/32; H01L 33/387; H01L 33/405; H01L 33/505; H01L 2933/0091; H01L 33/56; H01L 33/60
See application file for complete search history.

(56) References Cited

U.S. PATENT DOCUMENTS

| | | | |
|---|---|---|---|
| 2013/0234192 A1* | 9/2013 | Kim | H01L 33/0008 257/98 |
| 2014/0124821 A1 | 5/2014 | Tomonari et al. | |
| 2014/0339587 A1* | 11/2014 | Kawaguchi | H01L 33/36 257/98 |
| 2015/0280071 A1 | 10/2015 | Takenaga et al. | |
| 2015/0349207 A1 | 12/2015 | Sogo et al. | |
| 2016/0043290 A1 | 2/2016 | Sogo et al. | |
| 2016/0095184 A1 | 3/2016 | Nakabayashi et al. | |
| 2016/0111614 A1 | 4/2016 | Lee et al. | |
| 2016/0329468 A1 | 11/2016 | Akram et al. | |
| 2017/0033262 A1 | 2/2017 | Takenaga et al. | |
| 2017/0141260 A1* | 5/2017 | Chen | H01L 33/46 |
| 2017/0288088 A1* | 10/2017 | Won Cheol | H01L 33/58 |

FOREIGN PATENT DOCUMENTS

| | | |
|---|---|---|
| JP | 2014-093509 A | 5/2014 |
| JP | 2014-207267 A | 10/2014 |
| JP | 2014-241401 A | 12/2014 |
| JP | 2015-192099 A | 11/2015 |
| JP | 2015-226038 A | 12/2015 |
| JP | 2016-039324 A | 3/2016 |
| JP | 2016-051829 A | 4/2016 |
| JP | 2016-72435 A | 5/2016 |
| JP | 2016-082231 A | 5/2016 |
| JP | 2016-526797 A | 9/2016 |
| JP | 2017-034231 A | 2/2017 |
| JP | 2017-92477 A | 5/2017 |

* cited by examiner

LIGHT EMITTING ELEMENT AND LIGHT EMITTING DEVICE

CROSS REFERENCE TO RELATED APPLICATIONS

This application claims priority to Japanese Patent Application No. 2017-183860 filed on Sep. 25, 2017, and Japanese Patent Application No. 2018-020681 filed on Feb. 8, 2018, the disclosures of which are hereby incorporated by reference in their entireties.

BACKGROUND

1. Technical Field

The present disclosure relates to a light emitting element and a light emitting device.

2. Description of Related Art

A light emitting element has been proposed, which includes: a semiconductor structure including an n-type semiconductor layer, a light emitting layer and a p-type semiconductor layer that are layered to expose a portion of the n-type semiconductor layer; an insulating film disposed on the semiconductor structure and having a plurality of openings; an n-electrode (contact) connected to the n-type semiconductor layer through one of the plurality of openings that has a bottom surface constituted by a portion of the n-type semiconductor layer exposed outside the light emitting layer and the p-type semiconductor layer; a p-electrode connected to the p-type semiconductor layer through one of the plurality of openings that has a bottom surface constituted by the p-type semiconductor layer; a p-side external connection part connected to the p-electrode; and an n-side external connection part connected to the n-electrode (for example, see JP 2010-525586 A).

SUMMARY

In such a light emitting element, in order to secure heat dissipation performance, an area of the n-side external connection part and an area of the p-side external connection part are preferably increased. Meanwhile, in the case where the p-side and n-side external connection parts are disposed on the n-type semiconductor layer exposed outside the light emitting layer and the p-type semiconductor layer, during bonding to a substrate, the thermal stress may concentrate around the region where the n-type semiconductor layer is exposed. Such stress concentration may lead to breakage of the insulating film and the electrode disposed at the region where the n-type semiconductor layer is exposed.

The present invention has been made in view of such a problem, and an object of the present disclosure is to provide a light emitting element and a light emitting device with which breakage of an insulating film, an electrode and the like due to thermal stress occurring in bonding to a substrate is prevented, while the heat dissipation performance is secured.

(1) A light emitting element according to one embodiment of the present invention includes a semiconductor layered body, an insulating film, a first electrode, a second electrode, a first external connection part, and a second external connection part. The semiconductor layered body includes a first semiconductor layer, a light emitting layer arranged over the first semiconductor layer, and a second semiconductor layer arranged over the light emitting layer. The first semiconductor layer is exposed from the light emitting layer and the second semiconductor layer at a plurality of exposed portions arranged in a plurality of columns with each of the columns extending in a first direction in a plan view. The insulating film covers the semiconductor layered body and defines a plurality of openings respectively located above the exposed portions. The first electrode is electrically connected to the first semiconductor layer at the exposed portions through the openings in the insulating film. The first electrode covers a part of the second semiconductor layer with the insulating film being disposed between the first electrode and the second semiconductor layer. The second electrode is electrically connected to the second semiconductor layer. The first external connection part is electrically connected to the first electrode and spaced apart from the exposed portions in the plan view. The first external connection part has a shape elongated in the first direction and is arranged between adjacent ones of the columns of the exposed portions in the plan view. The second external connection part is electrically connected to the second electrode.

(2) A light emitting device according to another embodiment of the present invention includes the light emitting element as described above, a substrate, and a covering member. The substrate includes wiring patterns on an upper surface of the substrate. The first external connection part and the second external connection part of the light emitting element being electrically connected to the wiring patterns so that the light emitting element is flip-chip mounted on the wiring patterns. The covering member covers the light emitting element including the first external connection part and the second external connection part, and the substrate.

(3) A light emitting device according to even another embodiment of the present invention includes a substrate, a light emitting element, a first external connection part and a second external connection part. The substrate includes wiring pattern. The light emitting element includes a semiconductor layered body, an insulating film, a first electrode and a second electrode. The semiconductor layered body includes a first semiconductor layer, a light emitting layer arranged over the first semiconductor layer, and a second semiconductor layer arranged over the light emitting layer, the first semiconductor layer being exposed from the light emitting layer and the second semiconductor layer at a plurality of exposed portions arranged in a plurality of columns with each of the columns extending in a first direction in a plan view. The insulating film covers the semiconductor layered body and defines a plurality of openings respectively located above the exposed portions. The first electrode is electrically connected to the first semiconductor layer at the exposed portions through the openings in the insulating film. The first electrode covers a part of the second semiconductor layer with the insulating film being disposed between the first electrode and the second semiconductor layer. The second electrode is electrically connected to the second semiconductor layer. The first external connection part is electrically connected to the first electrode and at least one of the wiring patterns, and spaced apart from the exposed portions the plan view. The first external connection part has a shape elongated in the first direction and is arranged between adjacent ones of the columns of the exposed portions in the plan view. The second external connection part is electrically connected to the second electrode and at least one of the wiring patterns.

In the light emitting element and the light emitting device according to the present disclosure, breakage of an insulating film, an electrode and the like due to thermal stress occurring during bonding to a substrate can be prevented, while the heat dissipation performance can be secured.

DETAILED DESCRIPTION OF EMBODIMENTS

The drawings referred to in the description below schematically show certain embodiments. In the drawings, the scale, interval, positional relationship and the like of members may be exaggerated, or illustration of members may be partially omitted. Further scale or interval of members may not coincide between a plan view and its corresponding cross-sectional view. Further in the following description below the same name and reference numeral denote the same or similar members, and the detailed description thereof will be omitted as appropriate.

Light Emitting Element 10

Figure 1A:
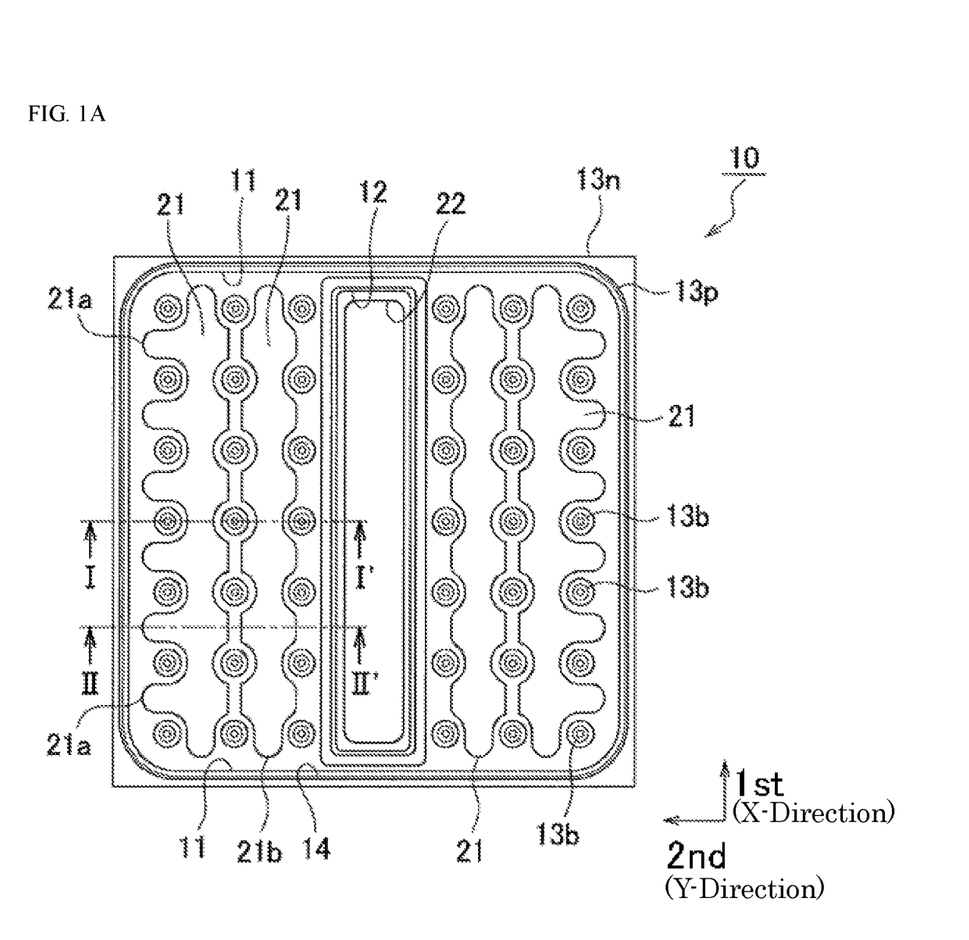
FIG. 1A is a plan view schematically showing a light emitting element according to an embodiment of the present disclosure.
Figure 1B:
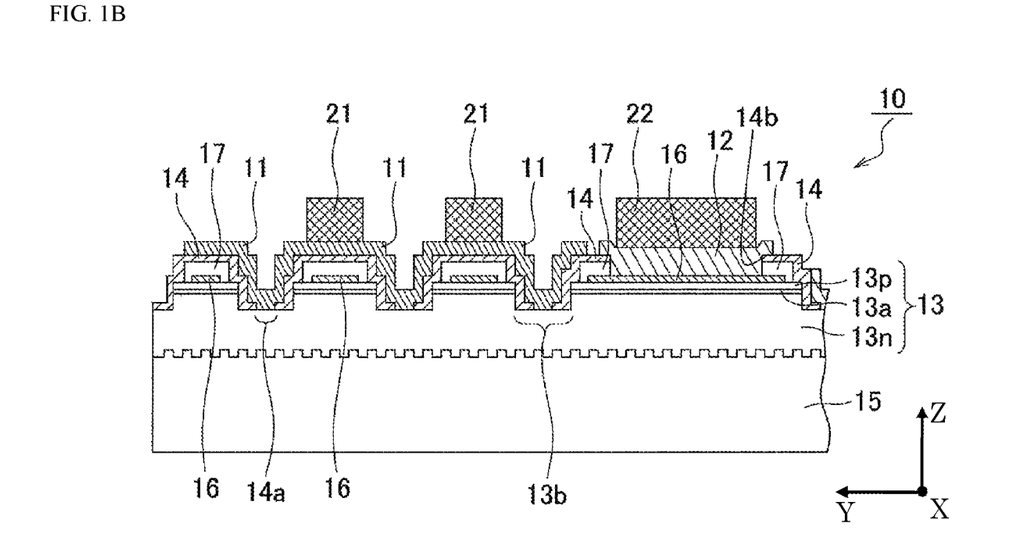
FIG. 1B is a schematic partial cross-sectional view of the light emitting element taken, along a line I-I' in FIG. 1A.
Figure 1C:
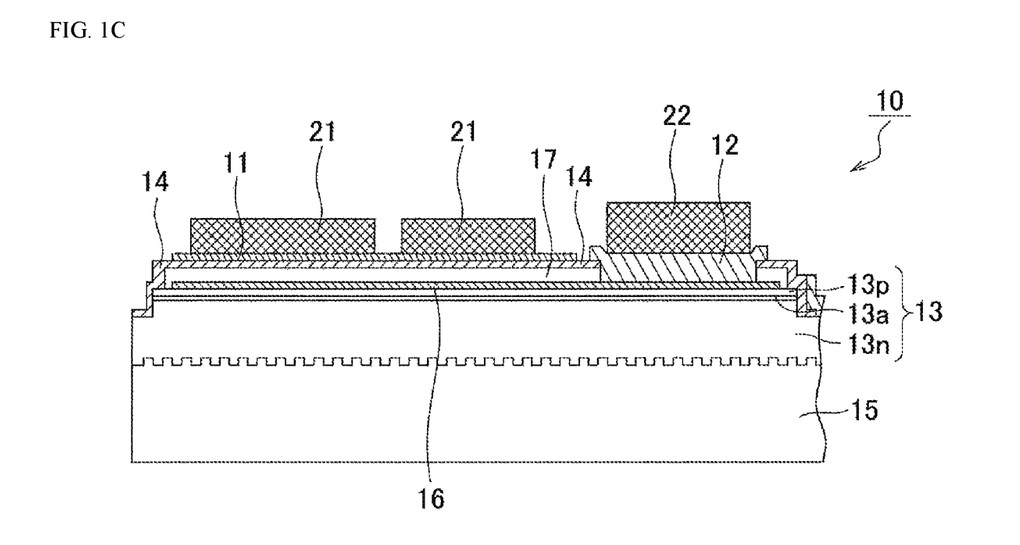
FIG. 1C is a schematic partial cross-sectional view of the light emitting element taken along line II-II' in FIG. 1A.

As show in FIGS. 1A to 1C, a light emitting element 10 according to an embodiment of the present disclosure includes: a semiconductor layered body 13 including, in sequence, a first semiconductor layer 13n, a light emitting layer 13a, and a second semiconductor layer 13p, and a plurality of exposed portions 13b arranged in columns with each of the columns extending in the first direction where the first semiconductor layer 13n is exposed outside the second semiconductor layer 13p and the light emitting layer 13a at a second semiconductor layer 13p side; an insulating film 14 covering the semiconductor layered body 13 and including openings 14a each located above a respective one of the plurality of exposed portions 13b; a first electrode 11 connected to the exposed portions 13b at the openings 14a and partially arranged on the second semiconductor layer 13p via the insulating film 14; a second electrode 12 electrically connected to the second semiconductor layer 13p; first external connection parts 21 connected to the first electrode 11 and each having a shape elongated in the first direction between the columns of the exposed portions 13b each arranged in the first direction while being spaced apart from the exposed portions 13b in a plan view; and a second external connection part 22 connected to the second electrode. The light emitting element 10 has a structure suitable for flip-chip mounting in which a surface at a side of the first electrode 11 and the second electrode 12 and the first external connection part 21 and the second external connection part 22 are provided is the mounting surface. The surface opposite to the mounting surface serves as the main light extraction surface.

In the present disclosure, the exposed portions arranged in the first direction are referred to as "a column of the exposed portions", and the exposed portions arranged in the second direction are referred to as "a row of the exposed portions".

Examples as planar shape of the light emitting element 10 include a polygonal shape such as a substantially quadrangular shape, a hexagonal shape, these shapes with rounded corners, a circular shape, and an oval shape. Among these, a substantially quadrangular shape is preferable.

Semiconductor Layered Body 13

The semiconductor layered body 13 of the light emitting element 10 includes the first semiconductor layer 13n, the light emitting layer 13a, and the second semiconductor layer 13p that are layered in sequence. Such a semiconductor layered body 13 is generally disposed on an insulating supporting substrate 15. The supporting substrate 15 may be removed from the light emitting element 10. The light emitting layer 13a and the second semiconductor layer 13p on the upper surface of the light emitting layer 13a are disposed on predetermined regions of the upper surface of the first semiconductor layer 13n. That is, in partial regions on the first semiconductor layer 13n, the second semiconductor layer 13p and the light emitting layer 13a are absent. The regions where the first semiconductor layer 13n is exposed outside the light emitting layer 13a and the second semiconductor layer 13p in this manner are referred to as the exposed portions 13b. That is, the semiconductor layered body 13 includes a plurality of holes spaced apart from each other in a plan view in the surface of the second semiconductor layer 13p. Each of the plurality of holes is defined by a bottom surface, which is constituted by the first semiconductor layer 13n, and a lateral surface, which is constituted by the second semiconductor layer 13p, the light emitting layer 13a, and a portion of the first semiconductor layer 13n in a thickness direction (Z-direction).

The shape, size, position, and the number of exposed portions 13b can be selected as appropriate according to the size, shape, electrode pattern and the like of the light emitting element to be obtained.

Each exposed portion 13b has a plan view shape of, for example, a circular or oval shape, or a polygonal shape such as a triangular, quadrangular, or hexagonal shape. Among these, a circular shape or a shape similar to a circle (for example, an oval or a polygonal shape having six or more angles) is preferable. The size of each exposed portion 13b can be adjusted as appropriate according to the size of the semiconductor layered body, the required output, luminance and the like of the light emitting element.

For example, it is preferable that the diameter of each exposed portion 13b is in a range of about several tens of micrometers to several hundred micrometers. From another viewpoint, preferably, the diameter of each exposed portion 13b is about 1/20 to 1/5 as great as one side of the semiconductor layered body. It is preferable that the exposed portions 13b are regularly arranged in a single light emitting element. More specifically, the exposed portions 13b are preferably arranged in a plurality of columns in the first direction. As used herein, the first direction (X-direction) refers to, for example, one direction parallel to one side of the semiconductor layered body 13 or the light emitting element 10. For example, the exposed portions 13b arranged in the first direction are preferably arranged in several columns. Further, the exposed portions 13b are also arranged in several or more rows, in each of which the exposed portions 13b are arranged in the second direction (Y-direction), which is perpendicular to the first direction. For example, the exposed portions 13b are preferably arranged in several rows to a dozen of rows, in each of which the exposed portions 13b are arranged in the second direction. In particular, it is preferable that the exposed portions 13b are arranged in three or more columns, in each of which the exposed portions 13b are arranged in the first direction so as to be adjacent to each other. In this embodiment, the number of the exposed portions 13b arranged in the second direction is preferably smaller than the number of the exposed portions 13b arranged in the first direction. In other words, the number of columns of the exposed portions 13b arranged in the second direction is preferably smaller than the number of exposed portions 13b arranged in a single column. Such an arrangement allows for increasing an area of the first external connection part, which will be described below, between the columns of the exposed portions arranged in the first direction.

The plurality of exposed portions 13b may all be substantially identical to each other, different from each other, or partially different from each other in shape and size in a plan view. With the exposed portions 13b, each of which is a region including no light emitting layer, regular arrangement of the plurality of exposed portions of similar size allows for reducing unevenness in light emitting area and current supply amount. Thus, unevenness in luminance over the entire light emitting element can be reduced.

The plurality of exposed portions 13b are preferably located inward of the outer periphery of the semiconductor layered body 13.

It is preferable that the total area of the exposed portions 13b arranged inward of the outer periphery of the semiconductor layered body 13 is 30% or less, 25% or less, 20% or less, 18% or less, and 15% or less of the planar area of the semiconductor layered body 13. Such a range allows a good balance between the current supply to the first semiconductor layer 13n and the current supply to the second semiconductor layer 13p, and allows for reducing unevenness in luminance due to uneven power supply.

It is preferable that the exposed portions 13b are preferably regularly arranged. Such an arrangement allows for reducing unevenness in luminance of the light emitting element, and so that light can be extracted uniformly. More specifically, each of the exposed portions 13b has a substantially circular shape in a top view.

Each of the exposed portions 13b has a diameter in a range of several tens of micrometers to several hundred micrometers. The exposed portions 13b are preferably arranged at regular intervals on the upper surface.

Examples of the semiconductor layered body 13 include various semiconductors such as a Group III-V compound semiconductor and a Group II-VI compound semiconductor. More specifically, for the semiconductor layered body 13, a nitride-lased semiconductor material such as $In_XAl_YGa_{1-X-Y}N$ ($0 \le X$, $0 \le Y$, $X \pm Y \le 1$), or InN, AlN, GaN, InGaN, AlGaN, or InGaAlN may be used. Each layer of the semiconductor layered body 13 may have any appropriate thickness and layer structure that are known in the art.

Insulating Film 14

The insulating film 14 covers an upper surface and a lateral surface of the semiconductor layered body 13.

The insulating film 14 defines the opening 14a above each exposed portion 13b and an opening 14b above the second semiconductor layer 13p. With the insulating film 14 covering the semiconductor layered body 13 and defining the opening 14a above each exposed portion 13b, the first electrode 11 can be disposed over a wide area in the upper surface of the insulating film 14 covering the upper surface of the second semiconductor layer 13p.

The insulating film 14 is preferably made of a material known in the art with a thickness that allows for securing electrical insulation. More specifically, the insulating film 14 may be made of a metal oxide or a metal nitride, for example, oxide or nitride of at least one element selected from the group consisting of Si, Ti, Zr, Nb, Ta, and Al.

First Electrode 11 and Second Electrode 12

The first electrode 11 and the second electrode 12 are arranged at an upper surface side of the semiconductor layered body 13 (that is, at a side opposite to the supporting substrate; on the second semiconductor layer side).

The first electrode 11 is connected to the exposed portions 13b at the openings 14a, of the insulating film 14 above the exposed portions 13b. The first electrode 11 is preferably connected to the exposed portions 13b to cover a plurality of exposed portions 13b.

It is more preferable that all the exposed portions 13b are covered with the first electrode 11 and collectively connected to the first electrode 11. Accordingly, the first electrode is arranged not only on the first semiconductor layer 13n but also above the second semiconductor layer 13p. That is, the first electrode 11 is arranged at the lateral surface (that is, the lateral surface of the light emitting layer 13a and the second semiconductor layer 13p) of the holes forming the exposed portions 13b and on the second semiconductor layer 13p via the insulating film 14.

The second electrode 12 is arranged on the second semiconductor layer 13p through the opening 14b of the insulating film 14 above the second semiconductor layer 13p, and connected to the second semiconductor layer 13p.

The first electrode 11 and the second electrode 12 may not be in direct contact with the first semiconductor layer 13n and the second semiconductor layer 13p, respectively, and may be electrically connected to the first semiconductor layer 13n and the second semiconductor layer 13p, respectively, via a conductive member such as a light reflective electrode, which will be described below.

The first electrode 11 and the second electrode 12 may be, for example, a single-layer film or a multilayer film of metal such as Au, Pt, Pd, Rh, Ni, W, Mo, Cr, Ti, Al, or Cu, or alloy of these metals. More specifically, these electrodes may be a multilayer film of, for example, Ti/Rh/Au, Ti/Pt/Au, W/Pt/Au, Rh/Pt/Au, Ni/Pt/Au, Al—Cu alloy/Ti/Pt/Au, Al—Si—Cu alloy/Ti/Pt/Au, or Ti/Rh, each in order from the semiconductor layer side. The first electrode 11 and the second electrode 12 may have any appropriate thickness in the art.

When the shape of the semiconductor layered body in a plan view is quadrangular, the shape of the outer periphery of the first electrode 11 in a plan view and that of the second electrode 12 in a plan view is preferably quadrangular or substantially quadrangular. The first electrode 11 and the second electrode 12 are alternately arranged adjacent to each other in one direction in a single semiconductor layered body in a plan view. For example, it is preferable that, the first electrode 11 and the second electrode 12 are arranged so that the first electrode is arranged on opposite sides of the second electrode in a plan view.

Light Reflective Electrode

The light emitting element 10 includes a light reflective electrode 16 interposed between the first electrode and/or the second electrode and the second semiconductor layer.

The light reflective electrode 16 may be made of silver, aluminum, or an alloy whose main component is silver or aluminum. In particular, silver or silver alloy has a high light reflectance with respect to light emitted from the light emitting layer, and thus is more preferable. The light reflective electrode 16 preferably has a thickness with which light emitted from the light emitting layer is effectively reflected. For example, the thickness may in a range of about 20 nm to 1 μm inclusive. The greater contact area between the light reflective electrode and the second semiconductor layer, the more preferable. Accordingly, the light reflective electrode 16 is preferably disposed further between the first electrode 11 and the second semiconductor layer 13p. More specifically, the total planar area of the light reflective electrode 16 may be 50% or more, 60% or more, and 70% or more of the planar area of the semiconductor layered body.

In the case where the light reflective electrode 16 contains silver, in order to prevent migration of silver, a protective Layer 17 may be disposed to cover the upper surface of the light reflective electrode 16, preferably the upper surface and the lateral surface of the light reflective electrode 16 may be provided. For the protective layer 17 a conductive member such as metal or alloy that is generally used as a material of electrodes may be used, or an insulating member may be used. The conductive member may be a single layer or a multilayer containing a metal such as aluminum, copper, or nickel. For the insulating member, a material similar to the above-described insulating film 14 may be used. In particular, SiN is preferably used. SiN has a high density, and thus if is good as a material for preventing entry of moisture. In order to effectively prevent migration of silver, the thickness of the protective layer 17 may in a range of about several hundred nanometers to several micrometers. In the case where the protective layer 17 is made of an insulating member, with the protective layer 17 including an opening above the light reflective electrode, the light reflective electrode and the second electrode can be electrically connected to each other. In the case where the light emitting element 10 includes the light reflective electrode 16 and the protective layer 17 on the second semiconductor layer 13p, the insulating film 14 covering the semiconductor layered body 13 further covers the light reflective electrode 16 and the protective layer 17, and includes an opening directly under the second electrode 12. Thus, the second electrode 12 and the light reflective electrode 16 are electrically connected to each other.

First External Connection Parts 21 and Second External Connection Part 22

The first external connection parts 21 and the second external connection part 22 are electrically connected to the first electrode 11 and the second electrode 12, respectively, and are provided to be connected to external components.

The first external connection parts 21 are disposed on the first electrode 11. The first external connection parts 21 are disposed, above the second semiconductor layer 13p, on the first electrode 11 provided at the upper surface of the insulating film 14, and arranged to be spaced apart from the exposed portions 13b in a plan view. The first external connection parts 21 are each arranged in the first direction between corresponding ones of the columns of the exposed portions 13b, with each of the column arranged in the first direction. The first external connection parts 21 have a shape elongated in the first direction. The length of the first external connection parts 21 in the first direction is slightly shorter than the length of the semiconductor layered body 13 in the first direction. More specifically, the length of the first external connection parts 21 in the first direction may be 85% to 95% as great as the length of the semiconductor layered body 13 in the first direction. The first external connection parts 21 are preferably arranged respectively between corresponding ones of the columns of the exposed portions 13b, with the exposed portions 13b arranged in the first direction in each of the columns.

Further, each of the first external connection parts 21 includes a plurality of projecting portions 21a extending in the second direction, which is perpendicular to the first direction, in a plan view. Each of the projecting portions 21a preferably extends between the exposed portions 13b adjacent to each other in the first direction. This structure allows increasing an area of the first external connection parts 21 in a plan view. In the case where each projecting portion 21a extends between the exposed portions 13b adjacent to each other in the first direction, the end of the projecting portion 21a may be located between the exposed portions 13b, or may be located outward of the exposed portions 13b. In particular, in the second direction, between the exposed portions 13b near the outer periphery of the light emitting element, each projecting portion 21a preferably extends farther than corresponding ones of the exposed portions 13b, so that the end of each projecting portion 21a is arranged closer to the outer periphery of the light emitting element than the corresponding ones of the exposed portions 13b are. That is, each projecting portion 21a of each of the first external connection parts 21 preferably includes an end that is closer to the outer periphery of the light emitting element than an end of outermost ones of the exposed portions 13b at a side of an outer-periphery of the light emitting element. Each projecting portion 21a has a width (that is, a length in the first direction) that allows, between corresponding ones of the exposed portions 13b, the projecting portion 21a to be located near the corresponding ones of the exposed portions 13b while avoiding electric short circuit. Each first external connection part 21 includes a plurality of projecting portions 21a.

While some of or all the projecting portions 21a may be different in size and in shape, at least those projecting portions 21a along the edge extending in the same direction are preferably the same in size and in shape.

The first external connection parts each preferably include the ends closer to the outer periphery of the light emitting element than the ends of outermost ones of the exposed portions closest to the outer periphery of the light emitting element are. That is, between the exposed portions arranged nearest to the outer edge of the semiconductor layered body 13 out of the exposed portions arranged in columns, in each of which the exposed portions are arranged in the first direction, each projecting portion 21a preferably extends farther than the exposed portions.

Further, in the case where the exposed portions are arranged in three or more columns in the first direction, the light emitting element includes a plurality of first external connection parts, and each of the plurality of first external connection parts is arranged between corresponding ones of the columns of the exposed portions. That is, two or more first external connection parts each extending between corresponding ones of the columns are preferably spaced apart from each other over the exposed portions 13b arranged in a column. With the first external connection parts each including the projecting portions 21a each extending between corresponding ones of the exposed portions being adjacent to each other along the first external connection part, an area of the first external connection part can be increased.

With the first external connection parts 21 disposed along the first direction in this manner each having the projecting portions 21a extending in the second direction being perpendicular to the first direction in a plan view, the first external connection parts can be disposed with a greater area on a region of the semiconductor layered body 13 except for the exposed portions 13b. The first external connection parts 21 and the exposed portions 13b do not overlap with each other in a plan view, so that, during bonding to the substrate 23 of the light emitting element which will be described below, breakage of the insulating film and the electrode near the exposed portions 13b due to stress during the bonding can be avoided. Further, with the first external connection parts 21 with a great, area that can be arranged at a surface of the light emitting element, the heat dissipation performance can be improved. Further, as described above, with two or more first external connection parts, each of which has a shape elongated in the first direction, arranged to be spaced apart from each other at both sides of a corresponding one of the columns of exposed portions 13b, during forming a covering member 27 between the light emitting element 10 and the substrate 23, which will be described later, an uncured resin material forming the covering member can be flown easily. Such improved flowability allows for reducing occurrence of voids or the like directly below the light emitting element 10. That is, with the first external connection parts each having a shape elongated in the first direction between the plurality of columns of exposed portions 13b, which are arranged in the first direction in each column, the uncured resin material forming the covering member can be easily flown in the first direction directly below the exposed portions 13b along the first external connection parts over the substrate 23. Thus, the resin material is easily disposed also inside the holes defining the exposed portions 13b, allowing for reducing occurrence of voids directly below the exposed portions 13b (that is, inside the holes defining the exposed portions).

Each of the first external connection parts 21 may have a plurality of projecting portions 21b extending in the first direction in a plan view.

In the case where the first external connection parts are adjacent to each other with corresponding ones of the exposed portions disposed therebetween, the closest distance between the first external connection parts may be, for example, 0.1% to 2% as great as the length of the semiconductor layered body 13.

The second external connection part is connected to the second electrode. The second external connection part 22 has, for example, a shape elongated in the first direction. The second external connection part 22 has a length in the first direction substantially equal to that of the first external connection parts 21 in the first direction, and may have a length in the second direction 5% to 20% as great as the length of the semiconductor layered body 13 in the second direction.

The second external connection part 22 is, for example, preferably arranged between the first external connection parts extending in the first direction. That is, in a plan view, the second external connection part preferably has a shape elongated in the first direction, and the first external connection parts 21 are arranged with the second external connection part 22 disposed between them. In this case, the first external connection parts 21 are more preferably disposed linear-symmetrically with respect to the center line of the second external connection part 22 in the first direction. Thus, unevenness in stress applied to the first external connection parts 21 and the second external connection part 22 during flip-chip mounting of the light emitting element 10 on the substrate 23 can be reduced. Accordingly, precision of the bonding can be stable. Further, reduction in unevenness in stress also contributes to improvement in flowability of the uncured resin material forming the covering member. Thus, thermal stress can be reduced.

The first external connection parts 21 and the second external connection part can be formed using a method known in the art, for example, plating, sputtering, vapor deposition or the like.

For example, when the first external connection parts 21 and the second external connection part 22 are formed by plating, a single layer of Al, μg, Al alloy, Ag alloy, Cu, Au, Ni or the like, or a multilayer structure of two or more of these may be used. At least an uppermost layer of each of the first external connection parts 21 and the second external connection part 22 is preferably made of Au, in order to prevent corrosion and to improve bondability to the substrate 23 using an Au alloy-based bonding member such as Au—Sn eutectic solder.

Light Emitting Element 30

Figure 3:
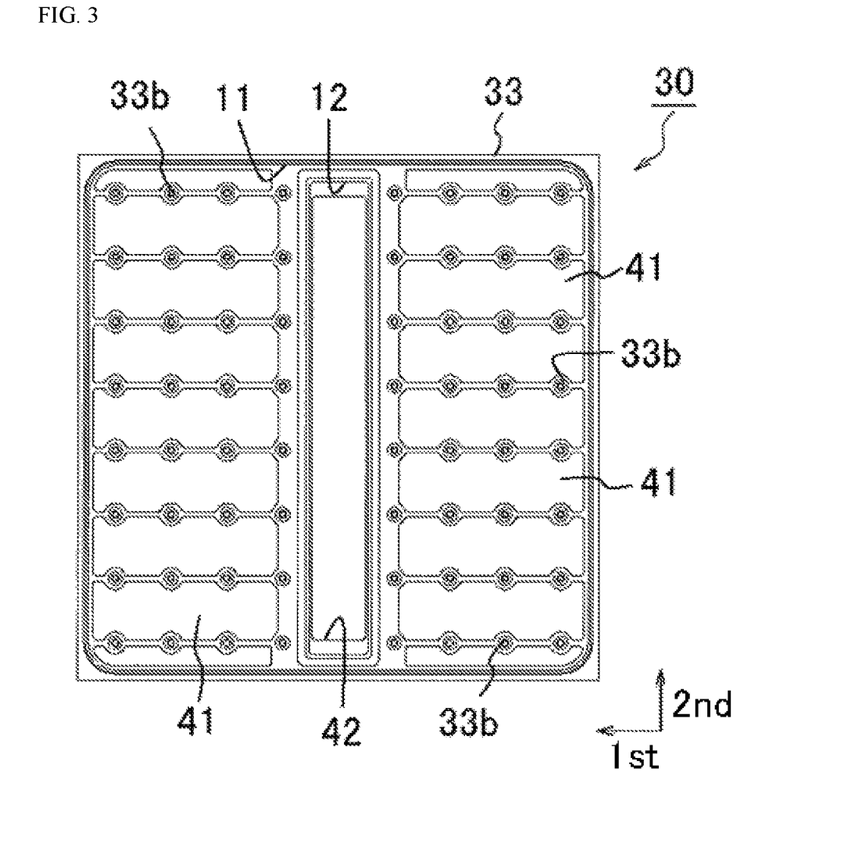
FIG. 3 is a plan view schematically showing a light emitting element according to another embodiment of the present disclosure.

As shown in FIG. 3, a light emitting element 30 according to the present embodiment has a structure substantially the same as the light emitting element 10 except that the number of the exposed portions 33b and the size of each of the exposed portions 33b at a semiconductor layered body 33 and the arrangement and shape of first external connection parts 41 are different from those of the light emitting element 10. As used herein, the expression "the size of each of the exposed portions 33b is different from that of the light emitting element 10" includes, in addition to the case in which the planar area of each of the exposed portions 33b is different from that of the light emitting element 10, the case in which a planar area ratio of each of the exposed portions 33b relative to the planar area of the semiconductor layered body 33 is different from that of the light emitting element 10.

In the light emitting element 30, for describing the arrangement of the exposed portions 33b and the first external connection parts 41, the first direction and the second direction are opposite to those in the light emitting element 10.

Exposed Portions 33b

In the light emitting element 30, it is preferable that the exposed portions 33b are arranged in a plurality of columns with each of the columns extending in the first direction, and are also arranged in a plurality of rows with each of the rows extending in the second direction, which is perpendicular to the first direction. For example, in FIG. 3, four rows of the exposed portions 33b each extending in the second direction are arranged to be adjacent to each other on each of opposite sides of the second electrode. Further, in each of the opposite sides of the second electrode, the exposed portions 33b are arranged also in eight columns, in each of which the exposed portions 33b are arranged in the first direction, to be adjacent to each other. That is, the number of the exposed portions 13b successively arranged in the second direction is greater than the number of the exposed portions 13b successively arranged in the first direction in the light emitting element 10. In other words, the number of the exposed portions 33b arranged in rows in the second direction is preferably greater than the number of the exposed portions 13b arranged in a single column in the light emitting element 10. Thus, an area of the first external connection parts, which will be described below, can be increased between the columns of the exposed portions arranged in the first direction.

First External Connection Parts 41 and Second External Connection Part 42

As shown in FIG. 3, each of the first external connection parts 41 is disposed along the first direction between corresponding ones of the columns of the exposed portions 33b arranged in the first direction. The first external connection parts 41 each have a shape elongated in the first direction. A length of the first external connection parts 41 in the first direction is shorter than a half of a length of the semiconductor layered body 13 in the first direction. More specifically, the length of each of the first external connection parts 41 in the first direction may be a half of 85% to 95% of the length of the semiconductor layered body 33 in the first direction. Each of the first external connection parts 41 is preferably arranged between corresponding ones of the columns of the exposed portions 13b each arranged in the first direction.

As shown in FIG. 3, the first external connection parts 41 are preferably arranged also between exposed portions 33b closest to the outer periphery of the light emitting element and the outer periphery of the light emitting element in a plan view.

Further, in the case where the exposed portions are arranged in three or more columns, in each of which the exposed portions are arranged in the first direction, the light emitting element preferably includes a plurality of the first external connection parts, and each of the plurality of the first external connection parts is disposed between corresponding ones of the columns. That is, two or more first external connection parts extending between corresponding ones of the columns are preferably arranged so as to be spaced apart from each other with corresponding ones of the columns of the exposed portions 33b disposed therebetween.

In the case where the first external connection parts are adjacent to each other with corresponding ones of the columns of the exposed portions 33b disposed therebetween, the shortest distance between corresponding ones of the first external connection parts is, for example, 0.1% to 2% as great as the length of the semiconductor layered body 33.

The second external connection part 42 is preferably arranged between the first external connection parts extending in the first direction. That is, in a plan view, preferably, the second external connection part has a shape elongated in the second direction, and the first external connection parts 41 are arranged with the second external connection part 42 disposed between them. In this case, more preferably, the first external connection parts 41 are linear-symmetrically arranged relative to the center line in the second direction of the second external connection part 42.

The thickness of the first external connection parts 21 and the second external connection part 22 may be in a range of, for example, 5 μm to 20 μm inclusive.

Light Emitting Device

Figure 2A:
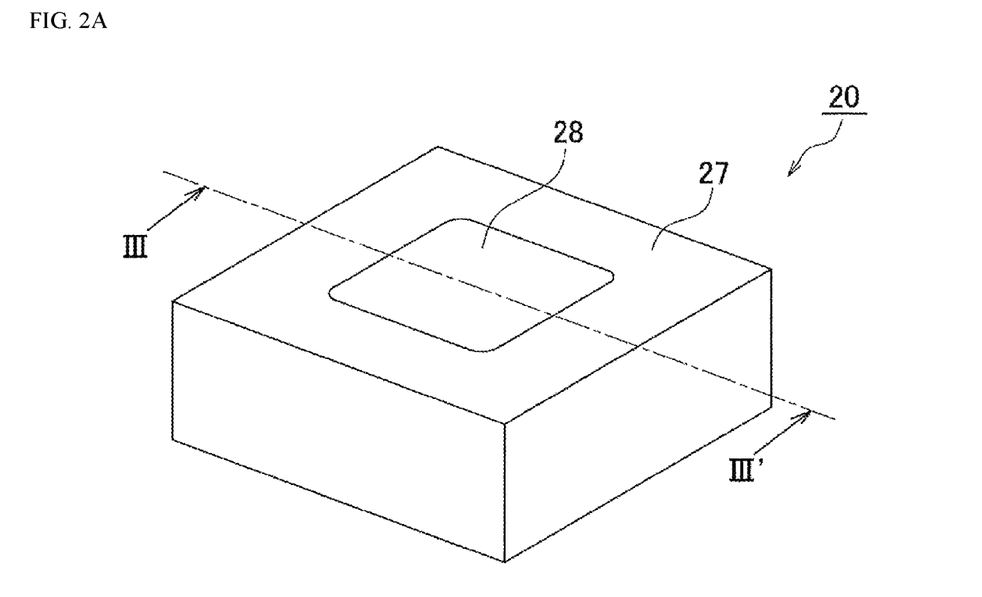
FIG. 2A is a perspective view schematically showing a light emitting device according to one embodiment of the present disclosure.
Figure 2B:
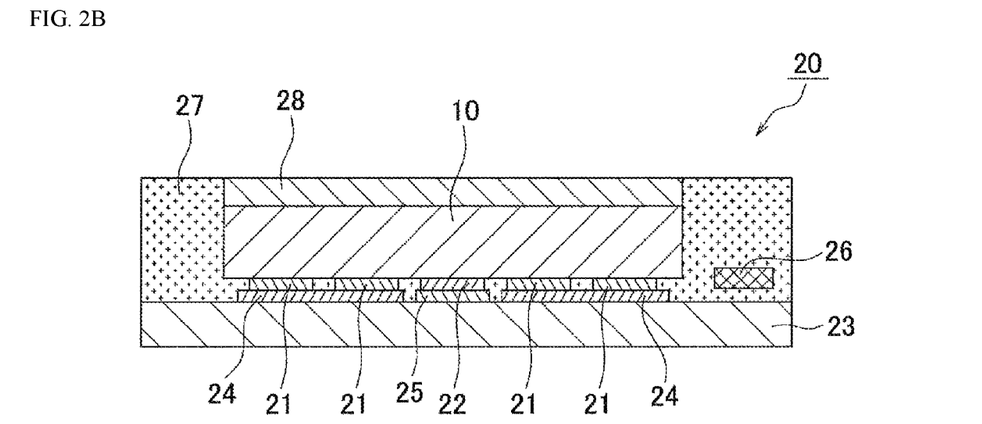
FIG. 2B is a cross-sectional view of the light emitting device taken along a line III-III' in FIG. 2A.

As shown in FIGS. 2A and 2B, the light emitting device 20 according to one embodiment of the present disclosure includes the substrate 23 including wiring patterns on an upper surface of the substrate 23, the light emitting element 10 as described above, and a covering member 27.

Substrate 23

The substrate 23 includes wiring patterns 24, 25 at the upper surface thereof, and the light emitting element 10 is flip-chip mounted on the wiring patterns 24, 25.

Examples of a material of the substrate include, an insulating member such as glass epoxy, resin, ceramic, or a metal member with an insulating member at a surface thereof. Among these, a material of the substrate is preferably ceramic, which has high heat resistant and weather resistant. Examples of the ceramic material include alumina and aluminum nitride.

The wiring patterns 24, 25 are allows for supplying current to the light emitting element, and a material, a thickness, and a shape of the wiring patterns 24, 25 is as generally employed in the art. More specifically, the wiring patterns 24, 25 can be made of a metal such as copper, aluminum, gold, silver, platinum, titanium, tungsten, palladium, iron, nickel or the like, or alloy containing the foregoing metals. In particular, the wiring patterns formed at the upper surface of the substrate has an outermost surface preferably covered, with a material exhibiting good reflectivity such as silver or gold so that light from the light emitting element 10 is efficiently extracted. The wiring patterns are formed by electrolytic plating, electroless plating, vapor deposition, sputtering or the like. For example, in the case where the outermost surface of each of the first external connection part 21 and the second external connection part 22 connected to the wiring patterns as the electrodes of the light emitting element 10 is made of gold, preferably the outermost surface of each of the wiring patterns is also composed of Au. This structure allows for improving the bondability between the light emitting element 10 and the substrate 23.

The wiring patterns 24, 25 preferably have positive and negative patterns at the upper surface of the substrate 23. Such wiring patterns allow the light emitting element 10 to be flip-chip mounted. When the light emitting element 10 is flip-chip mounted on the substrate 23 with the surface where the first external connection part 21 and the second external connection part 22 are formed serving as the lower surface of the light emitting element 10, the upper surface of the light emitting element 10 opposite to the lower surface serves as the main light extraction surface of the light emitting element 10. The wiring patterns 24, 25 may be arranged not only at the upper surface of the substrate 23 but also at an inside and/or the lower surface of the substrate 23.

Bonding between the first external connection parts 21 and the wiring patterns 24 and between the second external connection part 22 and the wiring pattern 25 in the light emitting element 10 may be performed by, for example, ultrasonic welding. Further, for the bonding member, bumps of gold, silver, or copper, metal paste containing metal powder of silver, gold, copper, platinum, aluminum, or palladium and resin binder, tin-bismuth-based solder, tin-copper-based solder, tin-silver-based solder, or gold-tin-based solder, or a brazing material such as low-melting-point metal may be used.

Covering Member 27

The covering member 27 covers the lateral surfaces of alae light emitting element 10, between the light emitting element 10 and the substrate 23, the upper surface of the substrate 23, and the lateral surfaces of the first external connection part 21 and the second external connection part 22. The covering member is preferably disposed also immediately below the exposed portions at the lower surface of the light emitting element. Further, as will be described below, in the case where the light emitting device 20 includes a light-transmissive member 28 at the upper surface of the light emitting element, the covering member 27 also covers the lateral surfaces of the light-transmissive member 28.

Examples of the covering member 27 include a light-reflective, a light transmissive resin, a light shielding resin, and these resins containing a light-reflective substance, a fluorescent material, a diffusing member, a coloring agent or the like. Among these, the covering member is preferably light reflective and/or light shielding. The resin, the light-reflective substance and the like of the covering member may be any material generally used in the art. For example, the resin may be a resin containing at least one of silicone resin, modified silicone resin, epoxy resin, modified epoxy resin, and acrylic resin, or a hybrid resin of two or more of these. The light-reflective substance may be titanium oxide, silicon oxide, zirconium oxide, potassium titanate, alumina, aluminum nitride, boron nitride, mullite, or the like.

The covering member 27 preferably contains a resin that has high flowability and adapted to be cured by being heated or irradiated with light, in view of facilitating entry thereof between the light emitting element 10 and the substrate 23 and facilitating prevention of occurrence of voids. Such a material may have flowability at, for example, the viscosity in a range of 0.5 Pa·s to 30 Pa·s. Further, with the content of the light-reflective substance in the material structuring the covering member 27 or the like, the amount of reflected light, the amount of transmitted light, and the like can be changed. The covering member 27 preferably contains, for example, 20 wt % or more the light-reflective substance.

The covering member 27 can be formed by, for example, injection molding, potting molding, resin printing, transfer molding, compression molding or the like.

Light-Transmissive Member 28

The light emitting device 20 preferably includes the light-transmissive member 28 on the upper surface of the light emitting element 10. The light-transmissive member 28 covers the light extraction surface of the light emitting element, and is transmissive of light emitted from the light emitting element by 50% or more, 60% or more, preferably 70% or more, to be released to the outside. The light-transmissive member may contain a fluorescent material that can convert the wavelength of at least a part of light exiting from the light diffusing member and the light emitting element 10. An outer periphery of the lower surface of the light-transmissive member 28 preferably coincides with an outer periphery of the upper surface of the light emitting element 10, or positioned inward or outward of the outer periphery of the upper surface of the light emitting element 10. The light-transmissive member 28 preferably has a plate-like shape, and the thickness of the light-transmissive member is in a range of, for example, 50 μm to 300 μm.

The light-transmissive member may be composed of, for example, resin, glass, an inorganic substance or the like.

Further, the light-transmissive member containing the fluorescent material may be a sintered body of a fluorescent material, or a resin, glass, or other inorganic substance containing a fluorescent material. Further, the light-transmissive member may be a molded body of a flat plate-shaped resin, glass, an inorganic substance or the like with a resin layer containing a fluorescent material on a surface of the molded body. The higher the transparency of the light-transmissive member is, the more easily light is reflected at the interface between the light-transmissive member and the covering member, so that luminance can be further improved.

In the case where the light emitting element 10 is a blue-color light emitting element or an ultraviolet light emitting element, examples of the fluorescent material contained in the light-transmissive member include a cerium-activated yttrium-aluminum-garnet-based fluorescent material (YAG:Ce), a cerium-activated lutetium-aluminum-garnet-based fluorescent material (LAG:Ce), a europium and/or chromium-activated nitrogen-containing calcium aluminosilicate-based fluorescent material ($CaO-Al_2O_3-SiO_2$:Eu), a europium-activated silicate-based fluorescent material (e.g., $(Sr, Ba)_2SiO_4$:Eu), a nitride-based fluorescent material such as a β-sialon fluorescent material (e.g., $Si_{6-z}Al_zO_zN_{8-z}$:Eu (0<Z<4.2)), a CASN-based fluorescent material, and a SCASN-based fluorescent material, a KSF-based fluorescent material ($K_2SiF_6$:Mn), a sulfide-based fluorescent material, and a quantum dot fluorescent material. A combination of a fluorescent material as described above and a blue-color light emitting element or an ultraviolet light emitting element allows for providing a light emitting device emitting light of desired emission color (for example, a light emitting device with an emission color of a white-based color). In the case where such a fluorescent material is contained in the light-transmissive member, the concentration of the fluorescent material is preferably in a range of, for example, about 5% to 50%.

The light-transmissive member is bonded to cover the light extraction surface of the light emitting element. The light-transmissive member and the light emitting element may be bonded to each other with or without an adhesive agent. The adhesive agent may be a resin material such as an epoxy resin or a silicone resin. The light-transmissive member and the light emitting element may be bonded to each other using a direct bonding method such as compression bonding, sintering, surface activated bonding, atomic diffusion bonding, or hydroxyl group bonding.

The light emitting device 20 may optionally include another element such as a protective element 26 or an electronic component. Such an element and an electronic component are preferably embedded in the covering member 27.

First Embodiment

As shown in FIGS. 1 to 1C, the light emitting element 10 according to a first embodiment includes a semiconductor layered body 13, an insulating film 14, a first electrode 11, a second electrode 12, first external connection parts 21 and a second external connection part 22.

On a supporting substrate 15 made of sapphire and baying a surface with irregularities, the semiconductor layered body 13 includes the first semiconductor layer 13n, the light emitting layer 13a, and the second semiconductor layer 13p layered in this order. The shape of the semiconductor layered body 13 in a plan view is a substantially square shape with each side of about 1.0 mm.

A plurality of exposed portions 13b, where the first semiconductor layer 13n is exposed outside the second semiconductor layer 13p and the light emitting layer 13a, is formed at a second semiconductor layer 13p side. The exposed portions 13b are arranged in rows and columns. Specifically, the exposed portions 13b are arranged in columns each including seven exposed portions 13b in the first direction, and are arranged in two groups of rows with each group including three rows of exposed portions in the second direction, which is perpendicular to the first direction, the two groups respectively arranged on two opposite sides of the semiconductor layered body in a plan view. Each of the exposed portions 13b has a circular shape having a diameter of about 36 μm in a plan view.
The distance between the centers of adjacent ones of the circles is about 130 μm in each of the first direction and in the second direction.

The semiconductor layered body 13 is covered with the insulating film 14 made of $SiO_2$. The insulating film 14 defines openings 14a, 14b respectively, at least above the plurality of exposed portions 13b and above a portion of the second semiconductor layer connected to the second electrode 12.

The light emitting element 10 includes the light reflective electrode 16 disposed between the first electrode and/or the second electrode and the second semiconductor layer.

The light reflective electrode 16 made of silver is disposed on a substantially entire surface between the second semiconductor layer 13p and the first electrode and/or the second electrode. An upper surface and a lower surface of the light reflective electrode 16 are covered with the protective layer 17.

At substantially the center of the semiconductor layered body 13, the second electrode 12 connected to the second semiconductor layer 13p via the light reflective electrode 16 is formed. The second electrode 12 has a shape elongated in the first direction in a plan view with a size of about 860 μm×140 μm.

Further, the first electrode 11 is formed on each of two opposite sides of the second electrode 12 in a plan view. The first electrode 11 is connected to each exposed portion 13b at the opening 14a of the insulating film 14, and further formed on the second semiconductor layer 13p via the insulating film 14.

A second external connection part 22 having a shape elongated in the first direction with a planar area slightly smaller than that of the second electrode 12 and connected to the second electrode 12 is arranged on the second electrode 12. The second external connection part 22 has a size of about 840 μm×120 μm.

Two first external connection parts 21 are arranged on each of two opposite sides of the second external connection part 22 in a plan view. That is, four first external connection parts 21 are provided in total. The first external connection parts 21 are connected to the first electrode 11. In a plan view, each of the first external connection parts 21 is spaced apart from corresponding ones of the exposed portions 13b, and has a shape elongated in the first direction between corresponding ones of the columns of the exposed portions 13b arranged in the first direction. The whole length of the first external connection parts 21 in the first direction is about 900 μm.

Each of the first external connection parts 21 includes a plurality of projecting onions 21a extending in the second direction in a plan view.

That is, the first, external connection parts 21 extend so as to laterally cross the semiconductor layer between corresponding ones of the exposed portions 13b adjacent to each other in the first direction, and each of the first external connection parts 21 includes projecting portions 21a extending between corresponding ones of the exposed portions 131 adjacent to each other in the second direction.

In the case where projecting portions 21a of one first external connection part extends toward another first external connection part arranged to be spaced apart from the one first external connection part, the end of each of the projecting portions 21a is located between corresponding ones of the exposed portions 13b.

In the case where projecting portions 21a extends toward the outer periphery of the semiconductor layered body 13, the end of each of the projecting portions 21a is located outward of the exposed portions 13b. That is, each projecting portion 21a of each first external connection part 21 has an end that is closer to the outer periphery of the light emitting element than an end of the exposed portion 13b closest to the outer periphery of the fight emitting element at a side of the outer periphery of the light emitting element is. Each projecting portion 21a has a width between the exposed portions 13b that allows for preventing projecting portion 21a from covering the exposed portions 13b so as to prevent electric short circuit. Each projecting portion 21a in a single first external connection part 21 is arranged between adjacent exposed portions 13b. That is, a single first external connection part includes a plurality of projecting, portions 21a at its outer periphery. The plurality of projecting portions 21a extending in the same direction has substantially the same size and shape.

That is, the projecting length of projecting portions 21a between the exposed portions closest to the outer periphery of the semiconductor layered body 13 is greater, and the projecting length of other projecting portions 21a between corresponding ones of the exposed portions 13b adjacent to each other inside the semiconductor layered body 13 is shorter.

For example, the distance between the tip of each projecting portion 21a and the outer periphery of the semiconductor layered body 13 is about 50 μm.
The distance between adjacent ones of first external connection parts 21 is about 24 μm.
The distance between the outer periphery of each exposed portion 13b and each first external connection part 21 is about 16 μm.
The distance between the first external connection part 21 and the second external connection part 22 is about 92 μm.

The four first external connection parts 21 each having such a shape are formed at the upper surface of the semiconductor layered body 13 to have an area of about 35% of an area of the upper surface in total.
The second external connection part 22 is formed at the upper surface to have an area of about 10% of an area of the upper surface.

Each of the first external connection parts 21 and the second external connection part 22 is formed by plating. The first external connection parts 21 and the second external connection part 22 have a multilayer structure of Al alloy/Au, with a total thickness of about 20 μm.

With the projecting portions 21a at the outer periphery of each first external connection part 21 in a plan view, the first external connection parts can be arranged except for the exposed portions 13b. Thus, during bonding the light emitting element to the substrate which will be described below, the insulating film and the electrodes around each exposed portion 13b can be prevented from being broken. Further, the first external connection parts 21 with a greater area can be arranged at one surface of the light emitting element except for the exposed portions 13b, so that the heat dissipation performance can be increased. Still further, with the first external connection parts 21 each having a shape elongated in the first direction, and additionally, as described above, with two or more first external connection parts being spaced apart from each other at both sides of the exposed portions 13b arranged in a column, when forming the covering member in the light emitting device which will be described below, the covering member can be flown directly below the light emitting element flip-chip mounted on a substrate.

Thus, good light extraction efficiency of the light emitting device can be obtained.

Second Embodiment

As shown in FIGS. 2A and 2B, a light emitting device 20 according to a second embodiment includes a substrate 23 including wiring patterns at its upper surface, and the light emitting element 10 as described above and the covering member 27 as described above.

The substrate 23 is made of alumina, and positive and negative wiring patterns 24, 25 are disposed on an upper surface of the substrate 23. In the wiring patterns 24, 25, the outermost surface is made of Au. The light emitting element 10 is flip-chip mounted on the substrate 23 with a surface where the first external connection part 21 and the second external connection part 22 are disposed serving as the lower surface.

As the light-transmissive member 28, YAG glass containing YAG by about 15 wt % is fixed to the upper surface of the light emitting element 10 via an adhesive agent made of a light-transmissive silicone resin. A thickness of the light-transmissive member 28 is about 180 μm, and the light-transmissive member 28 is arranged so that the outer periphery thereof in a plan view substantially coincides with the outer periphery of the light emitting element 10.

On the lateral side of the light emitting element 10, the protective element 26 is disposed. The protective element 26 is, for example, a Zener diode.

The covering member 27 covers the lateral surface of the light emitting element 10, and the space between the light emitting element 10 and the substrate 23. The covering member 27 further covers all of the upper surface of the substrate 23, the lateral surfaces of each first external connection part 21 and that of the second external connection part 22, and embeds the protective element 26 therein. Further, the covering member also covers the lateral surface of the light-transmissive member 28 while the upper surface of the light-transmissive member 28 is exposed outside the covering member.

The covering member 27 is made of modified silicone resin containing titanium oxide by about 30 wt %, and is light reflective.

In the light emitting device having such a structure, as described above, the light emitting element can have the heat dissipation performance and breakage near the exposed portions due to withstanding the stress load applied during mounting can be effectively prevented. Accordingly, a high-quality light emitting device exhibiting high light extraction efficiency can be provided.

Third Embodiment

As shown in FIG. 3, a light emitting element 30 according to a third embodiment have a structure substantially the same as the light emitting element 10, except for the number and site of exposed portions 33b arranged at the semiconductor layered body 33, and the arrangement and shape of first external connection parts 41. The shape of the light emitting element 30 in a plan view is a substantially quadrangular shape with a site of approximately 1.4 mm×1.4 mm.

The exposed portions 33b in the semiconductor layered body 33 are arranged in two groups of columns each including four rows of exposed portions 33b each extending in the second direction, the two groups respectively arranged on opposite sides of the semiconductor layered body, and arranged in columns each including eight columns of exposed portions 33b each extending in the first direction, which is perpendicular to the second direction. The exposed portions 33b each have a circular shape baying a diameter of about 36 μm in a plan view. The distance between the centers of adjacent ones of the circles in one group is about 150 μm in the first direction and about 170 μm in the second direction.

The second external connection part 42 having a shape elongated in the second direction is disposed at the central portion of the semiconductor layered body 33. The second external connection part 42 has a site of about 840 μm×120 μm.

On each of opposite sides of the second external connection part 42, nine first external connection parts 41 are arranged.

That is, eighteen first external connection parts 41 are provided in total. In a plan view, each of the first external connection parts 41 is spaced apart from corresponding ones of the exposed portions 33b, and has a shape elongated in the first direction between corresponding ones of the columns of the exposed portions 33b that are arranged in the first direction in each of the columns. The whole length of the first external connection parts 21 in the first direction is about 350 μm. Similarly to the above-described light emitting element 10, when the light emitting element 30 is flip-chip mounted on the substrate to form a light emitting device, the light emitting element 30 can have good light extraction efficiency.

Fourth Embodiment

Figure 4:
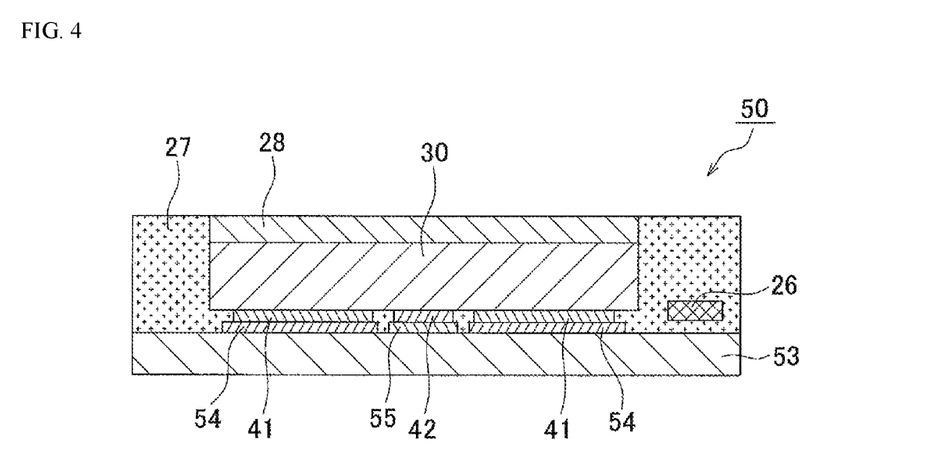
FIG. 4 is a cross-sectional view of a light emitting device according to even another embodiment of the present disclosure.

As shown in FIG. 4, a light emitting device 50 according to a fourth embodiment has a structure substantially the same as that of the light emitting device 20, except for including a substrate 53 that includes wiring patterns 54, 55 disposed on an upper surface of the substrate 53 and the above-described light emitting element 30.

As in the above-described light emitting device 20, the light emitting device 50 can be a high-quality light emitting device exhibiting high light extraction efficiency.

Fifth Embodiment

A light emitting device according to a fifth embodiment has a structure substantially the same as that of the light emitting devices 20, 50 except that a light emitting element as in the above-described light emitting, element 10 or 30 includes no first external connection parts and no second external connection part, and is connected to the substrate 53 including the wiring patterns 24, 25 or 54, 55 on its upper surface via first external connection parts and a second external connection part respectively having similar shapes as in the first external connection parts and the second external connection part of the light emitting element 10 or 30.

This light emitting device can be formed using the substrate on which the first external connection parts and the second external connection part are formed on the wiring patterns.

As in the above-described light emitting devices 20, 50, such a light emitting device can be a high-quality light emitting device exhibiting high light extraction efficiency.

What is claimed is:

1. A light emitting element comprising:
    a semiconductor layered body including
        a first semiconductor layer having a main surface extending in an X-direction and a Y-direction perpendicular to the X-direction,
        a light emitting layer having a main surface extending in the X-direction and the Y-direction, and arranged over the first semiconductor layer, and
        a second semiconductor layer having a main surface extending in the X-direction and the Y-direction, and arranged over the light emitting layer,
        the first semiconductor layer, the light emitting layer and the second semiconductor layer being layered in a Z-direction perpendicular to the X-direction and the Y-direction,
        the first semiconductor layer being exposed from the light emitting layer and the second semiconductor layer at a plurality of exposed portions arranged at least in a first column, a second column, and a third column with each of the first, second and third columns extending in the X-direction and the second column being disposed between the first column and the third column as viewed along the Z-direction, each of the first, second and third columns including a plurality of the exposed portions;
    an insulating film covering the semiconductor layered body and defining a plurality of openings respectively located above the exposed portions;
    a first electrode electrically connected to the first semiconductor layer at the exposed portions through the openings in the insulating film, the first electrode covering a part of the second semiconductor layer with the insulating film being disposed between the first electrode and the second semiconductor layer;
    a second electrode electrically connected to the second semiconductor layer;
    a first external connection part and an additional first external connection part electrically connected to the first electrode and spaced apart from the exposed portions as viewed along the Z-direction, each of the first external connection part and the additional first external connection part having a shape elongated in the X-direction with the first external connection part continuously extending in a region between the first column and the second column and the additional first external connection part continuously extending in a region between the second column and the third column while none of the exposed portions in the first, second and third columns is entirely enclosed by the first external connection part as viewed along the Z-direction; and
    a second external connection part electrically connected to the second electrode.

2. The light emitting element according to claim 1, wherein
    the first external connection part has a corrugated edge including a plurality of projecting portions projecting in the Y-direction.

3. The light emitting element according to claim 2, wherein
    each of the projecting portions extends between adjacent ones of the exposed portions in a corresponding one of the first and second columns.

4. The light emitting element according to claim 1, wherein
    the first external connection part includes an end that is closer to an outer periphery of the light emitting element than an end of a corresponding one of the exposed portions located closest to the outer periphery of the light emitting element as viewed along the Z-direction.

5. The light emitting element according to claim 1, further comprising
    the second external connection part has a shape elongated in the X-direction.

6. The light emitting element according to claim 1, wherein
    a number of columns of the exposed portions including the first, second and third columns is smaller than a number of the exposed portions arranged in each of the columns as viewed along the Z-direction.

7. The light emitting element according to claim 1, further comprising
    the second external connection part has a shape elongated in the Y-direction.

8. The light emitting element according to claim 1, wherein
    a number of columns of the exposed portions including the first, second and third columns is greater than a number of the exposed portions arranged in each of the columns as viewed along the Z-direction.

9. The light emitting element according to claim 1, wherein
    an uppermost layer of the first external connection part and an uppermost layer of the second external connection part are Au layers.

10. The light emitting element according to claim 1, wherein
    each of the first external connection part and the second external connection part has a thickness in a range of 5 μm to 20 μm.

11. A light emitting device comprising:
    the light emitting element according to claim 1;
    a substrate including wiring patterns on an upper surface of the substrate, the first external connection part, the additional first external connection part, and the second external connection part of the light emitting element being electrically connected to the wiring patterns so that the light emitting element is flip-chip mounted on the wiring patterns; and
    a covering member covering the substrate and the light emitting element including the first external connection part, the additional first external connection part, and the second external connection part.

12. The light emitting device according to claim 11, wherein
    the covering member contains a light-reflective substance.

13. The light emitting device according to claim 11, wherein
    the covering member contains a resin.

14. The light emitting device according to claim 11, further comprising
a light-transmissive member arranged on an upper surface of the light emitting element.

15. The light emitting device according to claim 14, wherein
the light-transmissive member contains a fluorescent material.

16. The light emitting device according to claim 11, wherein
the substrate is made of alumina or aluminum nitride.

17. The light emitting device according to claim 12, wherein
the covering member contains a resin.

18. A light emitting device comprising:
a substrate including wiring pattern;
a light emitting element including
a semiconductor layered body including a first semiconductor layer having a main surface extending in an X-direction and a Y-direction perpendicular to the X-direction, a light emitting layer having a main surface extending in the X-direction and the Y-direction and arranged over the first semiconductor layer, and a second semiconductor layer having a main surface extending in the X-direction and the Y-direction and arranged over the light emitting layer, the first semiconductor layer, the light emitting layer and the second semiconductor layer being layered in a Z-direction perpendicular to the X-direction and the Y-direction, the first semiconductor layer being exposed from the light emitting layer and the second semiconductor layer at a plurality of exposed portions arranged at least in a first column, a second column, and a third column with each of the first second and third columns extending in the X-direction and the second column being disposed between the first column and the third column as viewed along the Z-direction, each of the first, second and third columns including a plurality of the exposed portions,
an insulating film covering the semiconductor layered body and defining a plurality of openings respectively located above the exposed portions,
a first electrode electrically connected to the first semiconductor layer at the exposed portions through the openings in the insulating film, the first electrode covering a part of the second semiconductor layer with the insulating film being disposed between the first electrode and the second semiconductor layer, and
a second electrode electrically connected to the second semiconductor layer;
a first external connection part and an additional first external connection part electrically connected to the first electrode and at least one of the wiring patterns, the first external connection part being spaced apart from the exposed portions while as viewed along the Z-direction, each of the first external connection part and the additional first external connection part having a shape elongated in the X-direction with the first external connection part continuously extending in a region between the first column and the second column and the additional first external connection part continuously extending in a region between the second column and the third column while none of the exposed portions in the first, second and third columns is entirely enclosed by the first external connection part as viewed along the Z-direction; and
a second external connection part electrically connected to the second electrode and at least one of the wiring patterns.

19. The light emitting device according to claim 18, wherein
the first external connection part has a corrugated edge including a plurality of projecting portions projecting in the Y-direction.

20. The light emitting element according to claim 1, wherein
the first electrode is continuously exposed between adjacent ones of the exposed portions in at least one of the first, second and third columns.

* * * * *